(12) United States Patent
Bjork et al.

(10) Patent No.: US 9,028,214 B2
(45) Date of Patent: May 12, 2015

(54) CONTROL SYSTEM FOR A WIND TURBINE

(75) Inventors: Mikael Bjork, Karlstad (SE); Ulf Axelsson, Karlstad (SE)

(73) Assignee: General Electric Company, Schenectady, NY (US)

( * ) Notice: Subject to any disclaimer, the term of this patent is extended or adjusted under 35 U.S.C. 154(b) by 602 days.

(21) Appl. No.: 13/392,270

(22) PCT Filed: Aug. 20, 2010

(86) PCT No.: PCT/EP2010/062170
§ 371 (c)(1),
(2), (4) Date: May 14, 2012

(87) PCT Pub. No.: WO2011/023637
PCT Pub. Date: Mar. 3, 2011

(65) Prior Publication Data
US 2012/0219421 A1    Aug. 30, 2012

(30) Foreign Application Priority Data

Aug. 24, 2009 (SE) ...................................... 0950602

(51) Int. Cl.
*F03D 9/00* (2006.01)
*F03D 7/02* (2006.01)
*G01R 31/36* (2006.01)
*H02J 9/06* (2006.01)

(52) U.S. Cl.
CPC ........... *F03D 9/003* (2013.01); *Y10T 29/49004* (2013.01); *F03D 7/0224* (2013.01); *F05B 2260/76* (2013.01); *F05B 2260/80* (2013.01); *F05B 2260/83* (2013.01); *F05B 2270/1074* (2013.01); *G01R 31/3631* (2013.01); *H02J 9/062* (2013.01); *Y02E 10/723* (2013.01); *Y02E 10/721* (2013.01); *Y02E 10/766* (2013.01); *Y02B 10/72* (2013.01)

(58) Field of Classification Search
CPC ... F03D 9/003; F03D 7/0224; F05B 2260/76; F05B 2260/80; F05B 2260/83; F05B 2270/1074
USPC ............................ 416/155, 1, 61, 41, 46, 47
See application file for complete search history.

(56) References Cited

U.S. PATENT DOCUMENTS

| | | | |
|---|---|---|---|
| 5,612,608 A | 3/1997 | Ishiguro et al. | |
| 2007/0267872 A1* | 11/2007 | Menke | 290/44 |
| 2009/0115191 A1* | 5/2009 | Warfen et al. | 290/44 |

FOREIGN PATENT DOCUMENTS

| | | | |
|---|---|---|---|
| EP | 1763126 B1 | 8/2009 | |
| WO | 2007/132303 A1 | 11/2007 | |
| WO | WO 2007132303 A1 * | 11/2007 | F03D 7/02 |
| WO | 2009/146848 A2 | 12/2009 | |
| WO | 2010/080391 A2 | 7/2010 | |
| WO | 2010/133444 A2 | 11/2010 | |

OTHER PUBLICATIONS

International Search Report from corresponding International Search Report PCT/EP2010/062170 dated Aug. 24, 2011.

* cited by examiner

*Primary Examiner* — Dwayne J White
*Assistant Examiner* — William Grigos
(74) *Attorney, Agent, or Firm* — Global Patent Operation; Douglas D. Zhang

(57) ABSTRACT

The present invention relates to a control system for a wind turbine, comprising an electrical device that is arranged for being used during normal operation of a wind turbine and a power source that is arranged to be used as an emergency power supply to a blade pitch motor, wherein the blade pitch motor is arranged to test at least one property of said power source. The invention also relates to a method for testing a power source.

13 Claims, 2 Drawing Sheets

CONTROL SYSTEM FOR A WIND TURBINE

Figure 1:
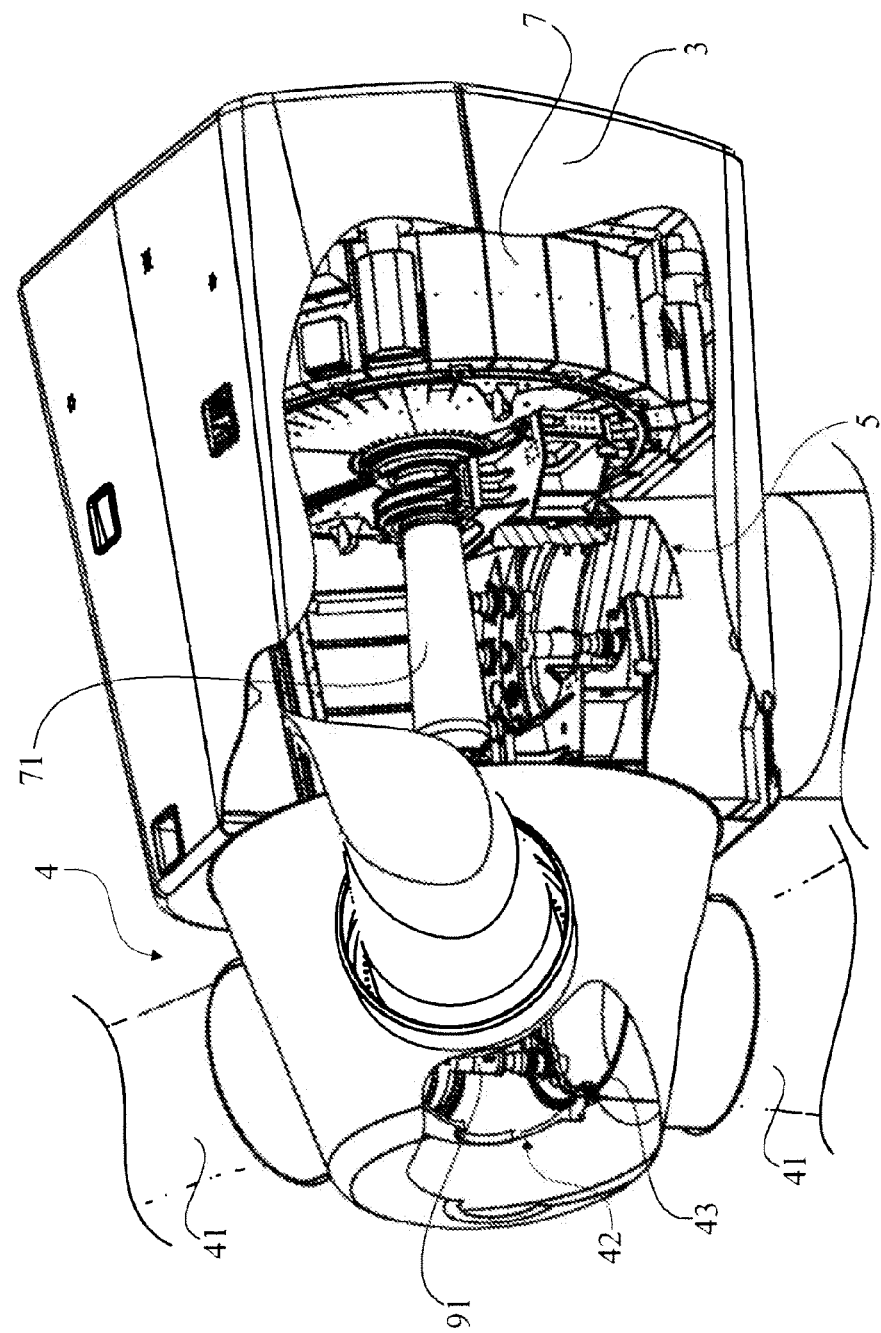

The present invention relates generally to a control system for a wind turbine, comprising an electrical device that is arranged for being used during normal operation of a wind turbine and a power source that is arranged to be used as an emergency power supply to said blade pitch motor. The present invention also relates generally to a method for testing a power source.

When using a wind turbine to generate electrical energy, it is important to maintain a high level of control over the turbine regardless of external or internal factors that may affect the wind turbine and its control system. For instance, in the event of a power failure it is necessary to achieve a secure braking of the turbine and rotor in order to avoid the risk for a spinning out of control that might result in serious damages to the entire wind turbine as well as the surrounding area.

In order to achieve such an emergency braking and stop, a wind turbine is generally equipped with a braking system that is powered by an emergency power supply such as a capacitor, a battery or other power source, connected to each pitch motor that during a power failure can be used for powering the pitch motor and thereby enable the rotor blades of the turbine to pitch to a feathered position, thus eliminating the risk of an uncontrolled spinning of the rotor after power has been lost in the system.

One problem associated with using such a power source as an emergency power supply is, however, that the performance of a power source can decline rapidly over time, so that the size of the current that will be accessible for operating the pitch control motor in an emergency situation is generally unknown if the components have started to age. Since the emergency braking is so crucial to the safe operation of the wind turbine, this is unacceptable.

A solution to this problem is a testing process which is performed at regular intervals, such as once or twice every year. During this process, a component such as a resistor is connected to the power source and the circuit closed in order for the discharging of the power source to be monitored. Thereby, the properties of the power source can be reliably tested, but the resistor needed for performing the testing is a bulky component that needs to be connected manually to the rotor. This is expensive, since the process is time consuming and requires a maintenance crew for monitoring the system. Another method is to provide resistors that are mounted onto the rotor and can be connected to the capacitors without the need for manual intervention at regular intervals. This, however, has the serious disadvantage of requiring that such resistors, that are generally bulky and expensive, be present on the rotor at all times during normal operation. The weight of the rotor is thus significantly increased, resulting in a less efficient and more expensive operation of the wind turbine as a whole.

There is therefore clearly a need for a better system for testing an emergency power supply (emergency power source) of a wind turbine.

One object of the present invention is to solve or at least to minimise the problems described above. This is addressed through a control system according to appended claim 1, wherein an electrical device is arranged to test at least one property of said power source. Thereby, a reliable testing of the power source can be achieved without the need for a separate component such as a resistor being present at the rotor, and without the need for manually connecting and disconnecting devices at a testing.

According to an aspect of the invention, said electrical device is arranged to test said power source at a predetermined interval. Thereby, the continuous supervision of the system is enabled, without the need for manual maintenance, and the properties of the power source can be analysed as needed, even remotely from the location where the wind turbine is placed.

According to another aspect of the invention, a variable-frequency drive is arranged adjacent to said electrical device. Thereby, a predetermined torque and frequency can be achieved, and properties such as the current from the power source can be measured. A close monitoring of the behaviour of the power source is thereby facilitated.

According to an aspect of the invention, said electrical device is a blade pitch motor for adjusting the pitch of at least one rotor blade. Thereby, a device that is already present and functioning in the wind turbine can be used also for the purpose of testing a power source, and thanks to the use of the motor, the properties regarding the current from the power source, as well as any other properties, can be measured in a reliable and very accurate way.

According to a further aspect of the invention, said power source is a capacitor. Thereby, a reliable, easily rechargeable and cost effective power source can be used with the wind turbine and the control system of the invention. However, it should be understood that the power source could be something else, for example a battery.

According to another aspect of the invention, said electrical device is heat insulated. Thereby, the risk for a fire or other damage that is caused by excessive heat can effectively be minimised, and the reliable operation of the wind turbine further secured.

According to yet another aspect of the invention, a method for testing a power source is also provided, comprising the steps of connecting a motor to a power source, creating a current through said motor for discharging said power source, and forming an assessment regarding at least one property of said power source based on the current through said motor. Thereby, a reliable testing of the power source can be achieved without the need for a separate component such as a resistor being present at the rotor, and without the need for manually connecting and disconnecting devices at a testing.

According to a further aspect of the invention, the testing can be performed automatically at set intervals and without the need for human interference. Thereby, the need for maintenance crews and the like at the site of the wind turbine can be significantly decreased, and the testing process can be performed as suitable without requiring monitoring or control at the time of testing.

Figure 2A:
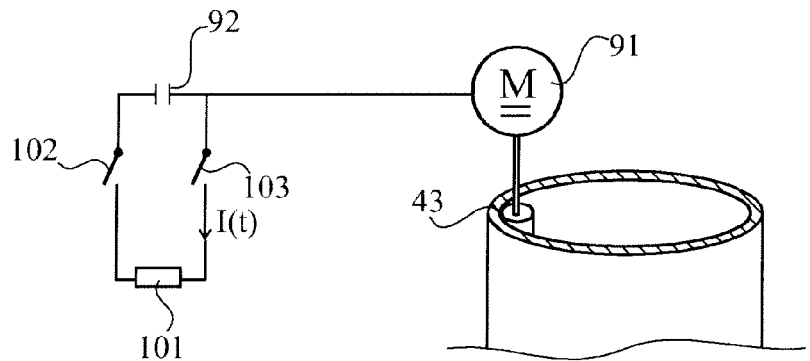
Figure 2B:
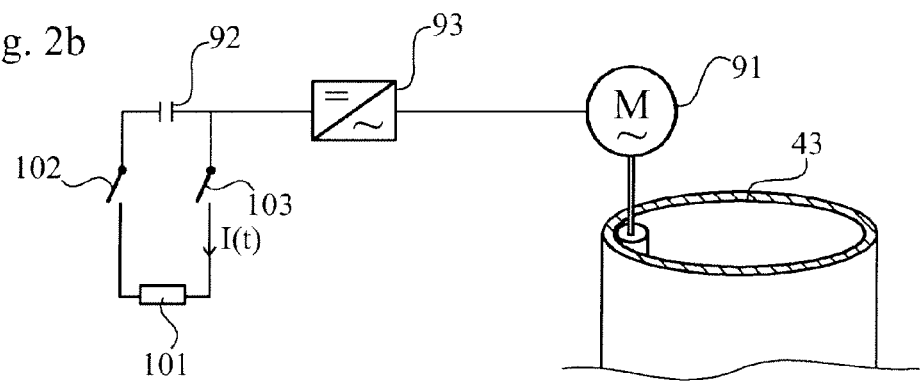
Figure 2C:
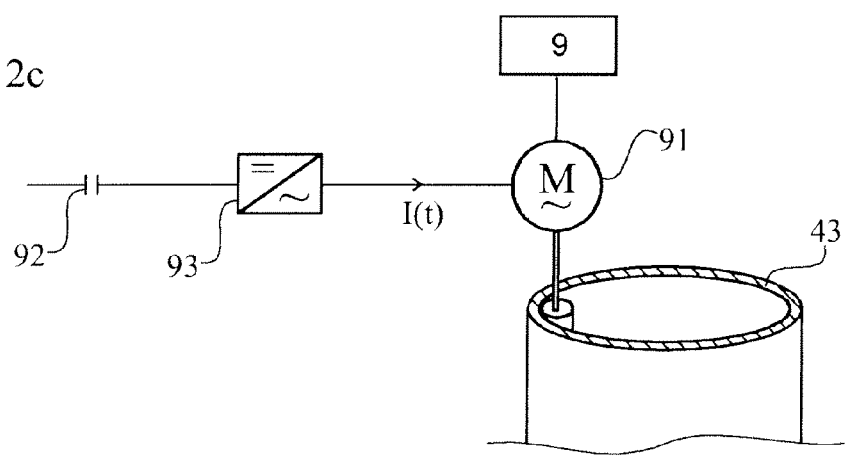

Various aspects and embodiments of the invention will now be described more in detail with reference to the appended drawings, wherein:

FIG. 1 shows a perspective view of a wind turbine with a control system according to a preferred embodiment of the invention, and FIG. 2a shows a control system according to a prior art device, FIG. 2b shows a control system according to another prior art device, and FIG. 2c shows a control system according to the preferred embodiment of the present invention.

In FIG. 1, a wind turbine is shown, with a nacelle 3 housing an electrical power generator 7 resting on a tower (not shown). The nacelle 3 can be turned with respect to the tower by means of a yaw system 5 that is controlled by a control system 9 (see FIG. 2c). Mounted on the nacelle 3 is a hub 4 housing a rotor shaft 71 that is coupled to a ball 42 of said hub 4, where rotor blades 41 are connected to said hub 4 by means of a blade bearing gear ring 43. The pitch of said rotor blades 41 can be altered by a blade pitch motor 91 mounted in the hub 4 and controlled by said control system 9.

FIG. 2a shows a system for powering the blade pitch motor 91 in the event of a power failure, according to the prior art. An emergency power source 92 for backup power in the form of a capacitor, for instance an ultracap, is shown, powering the blade pitch motor 91.

Said blade pitch motor 91 is a DC motor (i.e. a motor of direct current type) and is arranged to interact with the gear ring 43. In the event of a power failure, the emergency power source 92 (for example a capacitor) serves as a power source and is able to power the blade pitch motor 91 long enough for the motor 91 to interact with the gear ring 43 in order to pitch the turbine blade 41 to a feathered position, thereby effectively reducing the risk of the wind turbine spinning out of control during the power failure. After the wind turbine has been returned to normal and a normal operation can be resumed, the power source 92 can be recharged by a power supply used to power the wind turbine, and thereby be made ready for a second use at another time.

Also shown in the Figure is a resistor 101 that is connected with the power source 92 to form a circuit with switches 102 and 103 for opening or closing said circuit. During testing of the power source 92, a process normally performed while the wind turbine 1 is at a standstill, the switches 102, 103 are closed and the resistor 101 connected to the power source 92. A current I(t) will now flow through the circuit, from a positive side of the power source 92 to a negative side, through the resistor 101 provided. The size of the current I(t) can be controlled by choosing an appropriate resistor 101, and by monitoring the process and the amount of time required for discharging the power supply, i.e. emptying the power source 92, a capacity of said power source 92 (e.g. a capacitor 92) can be estimated. The resistor 101 can be removed after testing and mounted again adjacent to the capacitor 92 next time a testing is required, or can be permanently mounted on the wind turbine 1.

It is to be noted that the components displayed by FIG. 2a-2c refer to the blade pitch motor 91 and power supply 92 of one of the turbine blades 41. Since more than one turbine blade 41 is generally present in a wind turbine 1, one such system of pitch motor 91 and power supply 92 can be present at each of said turbine blades 41, or a central system can be used to power all of the turbine blades 41 simultaneously.

FIG. 2b shows another control system according to the prior art, where an AC motor is used as blade pitch motor 91 and interact with the gear ring 43. In order for the blade pitch motor 91 to be powered by a power source 92 (shown in FIG. 2b as a capacitor), a variable-frequency drive 93 is mounted between the power source 92 and the motor 91, and transform the dead current provided by the power source 92 into an alternating current that is suitable for powering the motor 91. In this system, a resistor 101 similar to that of FIG. 2a is provided for creating a closed circuit via switches 102, 103 with the power source 92, and the testing is performed in a manner similar to that of FIG. 2a.

FIG. 2c, on the other hand, shows a control system according to a preferred embodiment of the present invention, where the power source 92 is connected to the blade pitch motor 91 via a variable-frequency drive 93 without the need for separate components such as resistors or the like for testing the power source 92. The power source 92 may be a capacitor but it could also be, for example, a battery. In the embodiment of FIG. 2c, the blade pitch motor 91 itself is used for the testing process, where a current I(t) is allowed to flow from the emergency power source 92 (for example a capacitor 92) through the blade pitch motor 91 and the process of emptying the emergency power source 92 can be closely monitored.

In the embodiment of FIG. 2c, the motor 91 is an AC motor (i.e. a motor of the alternating current type). To test the capacitor 92, the variable-frequency drive 93 may be set to deliver a small current of a low frequency to the AC motor 91. What is fed to the AC motor 91 is only the so called magnetization current which is so small and has such a low frequency that it is insufficient to actually cause the AC motor 91 to act and turn the rotor blades. Instead, the AC motor 91 functions only as a resistance for the current. In this way, power from the emergency power source 92 is consumed but the rotor blades do not turn. The variable-frequency drive 93 may be set to provide a current of a constant intensity to the motor 91. By monitoring how quickly the voltage in the emergency power source 92 decreases, a property of the power source 92 can be tested. In other words, the state or condition (performance) of the power source 92 can be tested. In particular, what is tested is the capacity of the power source (i.e. how much energy it is capable of storing). The testing may be done by reading the value of the voltage at one point in time and then reading the voltage at a later point in time. The difference can be used to determine how quickly the voltage falls. From this, the condition of the power source 92 can be determined. Of course, the above described testing can need not be restricted to only two points in time. Since the voltage could possibly decrease in a way that is non-linear, values for the current may be read at, for example, three points in time or four points in time. Of course, more than four readings would also be possible. By using more than two readings, a more precise understanding of the process may be obtained.

As an alternative to feeding a current of constant intensity to the motor 91, it is also possible to allow the current to decrease as the voltage decreases. In this case, it would be possible to monitor how quickly the current decreases. Reading scan be made in the same way as described above.

The variable-frequency drive 93 may itself be used to read values for the current that it receives from the emergency power source 92 and/or the voltage of the emergency power source 92.

The AC blade pitch motor can thus be used to test the emergency power source without requiring a corresponding pitch movement of the rotor blades.

By controlling the variable-frequency drive 93 to give a predetermined torque and frequency, and by the relationship between this torque and the current I(t) that is known to be directly proportional, the power source 92 (e.g. a capacitor) can be emptied using the blade pitch motor 91, and a discharge curve be drawn that closely describes the process. Thereby, it becomes possible to achieve a well-defined discharge and to gain knowledge of the entire performance of the power source 92.

The principle of feeding a current from the power source 92 to the motor 91 and monitor how the voltage and/or the current falls may be applied also if the motor is a DC motor. However, if the blade pitch motor is a DC motor, it would have to be locked during testing to prevent it from acting on the rotor blades. When the motor is an AC motor, it does not have to be locked since a magnetization current can be used which is incapable of causing the motor to operate and turn the rotor blades. Therefore, the use of an AC motor entails, inter alia, the advantage that testing can be made more easily.

The prior art methods, by contrast, require the presence of a separate and often bulky component in the form of the resistor 101, which either must be present in the hub 4 of the wind turbine 1 at all times, and thereby add a significant extra weight to the wind turbine 1 during its operation, or it must be mounted by a maintenance crew specifically for testing the capacitor 92 at a predetermined time, thereby making the testing process increasingly costly. In order to achieve accurate discharge information, the resistor 101 must also be in good condition, and should preferably be of a high quality, which is generally more expensive. Also, the presence of a resistor 101 at the hub 4 during normal operation can be a fire hazard, since the use of the resistor 101 will generally generate heat. If the resistor 101 is not properly mounted surrounded by a layer of air for cooling, the temperature can become dangerously high, and if a layer of dirt and fat has been accumulating on the resistor, an ignition may take place, resulting in possible damage to the entire wind turbine 1.

By using a system according to various embodiments of the invention, however, the disadvantages described in relation to the prior art can be avoided, and thanks to the preciseness of the information that can be gathered from the blade pitch motor 91, a detailed discharge curve can be achieved at a relatively low cost. The risk for fire or other damages is also significantly lower, since a motor is generally encased in insulating material in order to lower precisely that risk and to protect the motor from wear and tear due to external factors.

Another advantage of various aspects of the invention is the possibility of testing the entire system required for an emergency stop of the wind turbine, i.e. the entire process from normal operation to a standstill, with the blade pitch motor or motors 91 testing the performance of the capacitor or other power supply at the same time. If it were necessary to mount a separate component such as a resistor at the wind turbine before a testing process, this would not be possible since a testing according to the prior art would require the wind turbine being at a standstill.

It is to be noted that the method for testing a power source can also be used in other applications than in relation to wind turbines, such as for instance any application where a capacitor is used for supplying power to a system or device.

The invention is not to be seen as limited by the preferred embodiment described above, but can be modified within the scope of the appended claims, as will be readily understood by the person skilled in the art. For instance, any type of power supply such as different types of capacitors or batteries of various types, such as Pb or NiCd for example, can be used for powering the emergency stop system of the wind turbine. Other properties than the current from the power supply may also be tested, directly or indirectly, and the state of the power supply determined from a single factor or from several.

Although certain embodiments of the invention have been described above in terms of a control system for a wind turbine having an electrical device in the shape of a blade pitch motor that is connected to an emergency power source, the general principle of testing the emergency power source on the electrical device it should be used to drive could be applied also to other components of a wind turbine.

Although various aspects of the invention have been described above in terms of a control system and a method of testing, it should be understood that these categories only reflect different aspects of one and the same invention.

What is claimed is:

1. A control system for a wind turbine, comprising:
   an electrical device that is arranged for being used during normal operation of a wind turbine; and
   a power source that is arranged to be used as an emergency power supply to said electrical device,
   wherein the electrical device is a blade pitch motor for adjusting a pitch of a rotor blade of the wind turbine,
   wherein the power source is configured to supply a current to the blade pitch motor so that the blade pitch motor tests at least one property of the power source, the current being insufficient to cause a pitch movement of the rotor blade.

2. The control system according to claim 1, wherein the blade pitch motor is arranged to test said power source at a predetermined interval.

3. The control system according to claim 1, wherein a variable-frequency drive is arranged between the blade pitch motor and the power source.

4. The control system according to claim 1, wherein the blade pitch motor is an AC motor.

5. The control system according to claim 1, wherein said power source is a capacitor.

6. The control system according to claim 1, wherein the blade pitch motor is heat insulated.

7. A method for testing a power source, the method comprising the steps of:
   a) connecting a blade pitch motor to a power source;
   b) creating a current through said blade pitch motor for discharging said power source, the current being insufficient to cause a pitch movement; and
   c) forming an assessment regarding at least one property of said power source based on step b).

8. The method according to claim 7, wherein the steps are automatically performed at set intervals and without the need for human interference.

9. The method according to claim 7, wherein said power source is a capacitor.

10. The method according to claim 7, wherein the power source is connected to the blade pitch motor via a variable-frequency drive and wherein the testing of the power source comprises setting the variable-frequency drive to deliver a current to the blade pitch motor and wherein the method further comprises monitoring how at least one of the current and the voltage of the power source decreases over time.

11. The method according to claim 7, wherein the power source is connected to the blade pitch motor via a variable-frequency drive and wherein the testing of the power source comprises setting the variable-frequency drive to deliver a current of constant intensity to the blade pitch motor and wherein the method further comprises monitoring how the voltage of the power source decreases over time.

12. The method according to claim 7, wherein the blade pitch motor is an AC motor.

13. The method according to claim 10, wherein the variable-frequency drive is used to monitor how at least one of the voltage of the power source and the intensity of the current decreases over time.

* * * * *